United States Patent
Noel

[11] Patent Number: 6,078,189
[45] Date of Patent: Jun. 20, 2000

[54] DYNAMIC TEST REORDERING

[75] Inventor: Leo A. Noel, Essex Junction, Vt.

[73] Assignee: International Business Machines Corporation, Armonk, N.Y.

[21] Appl. No.: 09/162,006

[22] Filed: Sep. 28, 1998

Related U.S. Application Data

[63] Continuation-in-part of application No. 08/768,000, Dec. 13, 1996, abandoned.

[51] Int. Cl.$^7$ .............................. G01R 31/28; G06F 15/20
[52] U.S. Cl. ...................... 324/765; 73/865.9; 73/865.5; 324/765
[58] Field of Search ................................. 324/765, 500, 324/537, 73.1; 364/468.17, 481, 580, 579; 73/865.8, 865.9, 865.5

[56] References Cited

U.S. PATENT DOCUMENTS

| | | | |
|---|---|---|---|
| 3,781,683 | 12/1973 | Freed . | |
| 4,728,883 | 3/1988 | Green | 324/537 |
| 4,875,002 | 10/1989 | Sakamoto et al. | 324/765 |
| 4,994,732 | 2/1991 | Jeffrey et al. | 324/537 |
| 5,004,978 | 4/1991 | Morris, Jr. et al. | 324/537 |
| 5,023,557 | 6/1991 | Moran et al. | 324/537 |
| 5,654,632 | 8/1997 | Ohno | 324/76 |

OTHER PUBLICATIONS

"A Logic Design Strcuture for LSI Testing" E. Eichelberger & T. W. Williams, 14th Design Automation Conference, Jun. 1977, p. 462–468.

*Primary Examiner*—Hezron Williams
*Assistant Examiner*—J. David Wiggins
*Attorney, Agent, or Firm*—James M. Leas

[57] ABSTRACT

A method of dynamically modifying a test program makes testing more efficient and less costly while avoiding errors from manual operations. In one embodiment the order of functional tests in the test program is dynamically changed based on the results of testing. Tests that have caused fails are moved earlier in the testing program without having to recompile the test program. Each functional test has an initialization step to set the chip in a state from which subsequent test vectors are run.

19 Claims, 1 Drawing Sheet

DYNAMIC TEST REORDERING

RELATED APPLICATIONS

This application is a continuation-in-part of patent application Ser. No. 8/768,000, filed Dec. 13, 1996 abandoned.

FIELD OF THE INVENTION

This invention generally relates to a method of testing electronic devices. More particularly, it relates to varying a test program dynamically in response to the results of testing. Even more particularly, it relates to dynamically reordering the sequence of tests in a test program in response to test data.

BACKGROUND OF THE INVENTION

Electronic devices, such as semiconductor chips, are usually tested with a battery of tests before they are shipped to customers. The tests check for the presence of known types of defects that may arise during manufacturing of the electronic device. The tests are usually generated by test engineers but many of them can also be generated automatically according to the design data for a particular electronic device. The tests are performed by an automatic tester that runs a test program. The tester has probes for contacting each electronic device in turn and the test program is run for each device.

A test program may include a series of parametric tests to detect shorts and opens, measure power supply current, and verify that drivers will drive a sufficient current at a specified voltage. The test program may also include a series of functional tests to ensure that the various circuits on the chip are operating as designed. The functional tests can be conducted through test patterns that are supplied by the tester or by one or more built in self-test structures fabricated on the chip itself The test program may also include performance tests to sort passing devices according to their speed. The program may also include tests of the power supply current drawn by the chip after test patterns have been applied to the chip.

In production, the test program is run to completion only on devices that pass all tests. To save test time and money, the test program is usually stopped immediately after the first failing test on a particular device, and that failing device is marked or sorted as a fail.

As experience with test fails and defects on electronic devices becomes available, the test program may be updated, adding or deleting tests or reordering tests in the program to optimize test efficiency. After the updated test program has been generated, it must then be compiled and loaded into the tester. The program must then be qualified for use on subsequent production electronic devices. That is, the test program itself must undergo an evaluation to ensure that it is properly functioning. The updating and reordering steps introduce the possibility of error into the program that could, for example, eliminate important tests and allow failing devices to pass. In addition, these steps of reviewing and analysing test data from failing devices, then using the analysis to update a test program, and then qualifying the new test program for use in production, have been time consuming and costly.

A better solution is needed that provides for rapid and low cost updating of test programs that reduces the risk of error. This solution is provided by the following invention.

SUMMARY OF THE INVENTION

It is therefore an object of the present invention to provide a process for dynamically updating a test program to make testing more efficient, lower cost, and less subject to error.

It is a feature of the present invention that tests of a test program are reordered during the testing of a group of electronic devices.

It is a feature of the present invention that human involvement in reviewing or analysing test data and reordering the tests is eliminated.

It is a feature of the present invention that the test program need not be recompiled, reloaded into the tester, or requalified after the order of tests in the test program is changed.

It is a feature of the present invention that a series of tests having a common power supply voltage condition can be reordered independent of the order of tests for a different power supply voltage condition.

It is an advantage of the present invention that a significantly increased efficiency of testing and a reduction in the cost of testing is achieved.

These and other objects, features, and advantages of the invention are accomplished by a method of testing a plurality of electronic devices comprising the steps of (a) providing a plurality of electronic devices to a tester for testing; (b) testing a first electronic device of the plurality of devices with a plurality of tests; (c) obtaining a result of the testing step (b); (d) dynamically modifying the plurality of tests based on the result in step (c); and (e) testing a second electronic device of the plurality of devices with the modified tests.

BRIEF DESCRIPTION OF THE DRAWINGS

The foregoing and other objects, features, and advantages of the invention will be apparent from the following detailed description of the invention, as illustrated in the accompanying drawings, in which.

DETAILED DESCRIPTION OF THE INVENTION

Figure 1:
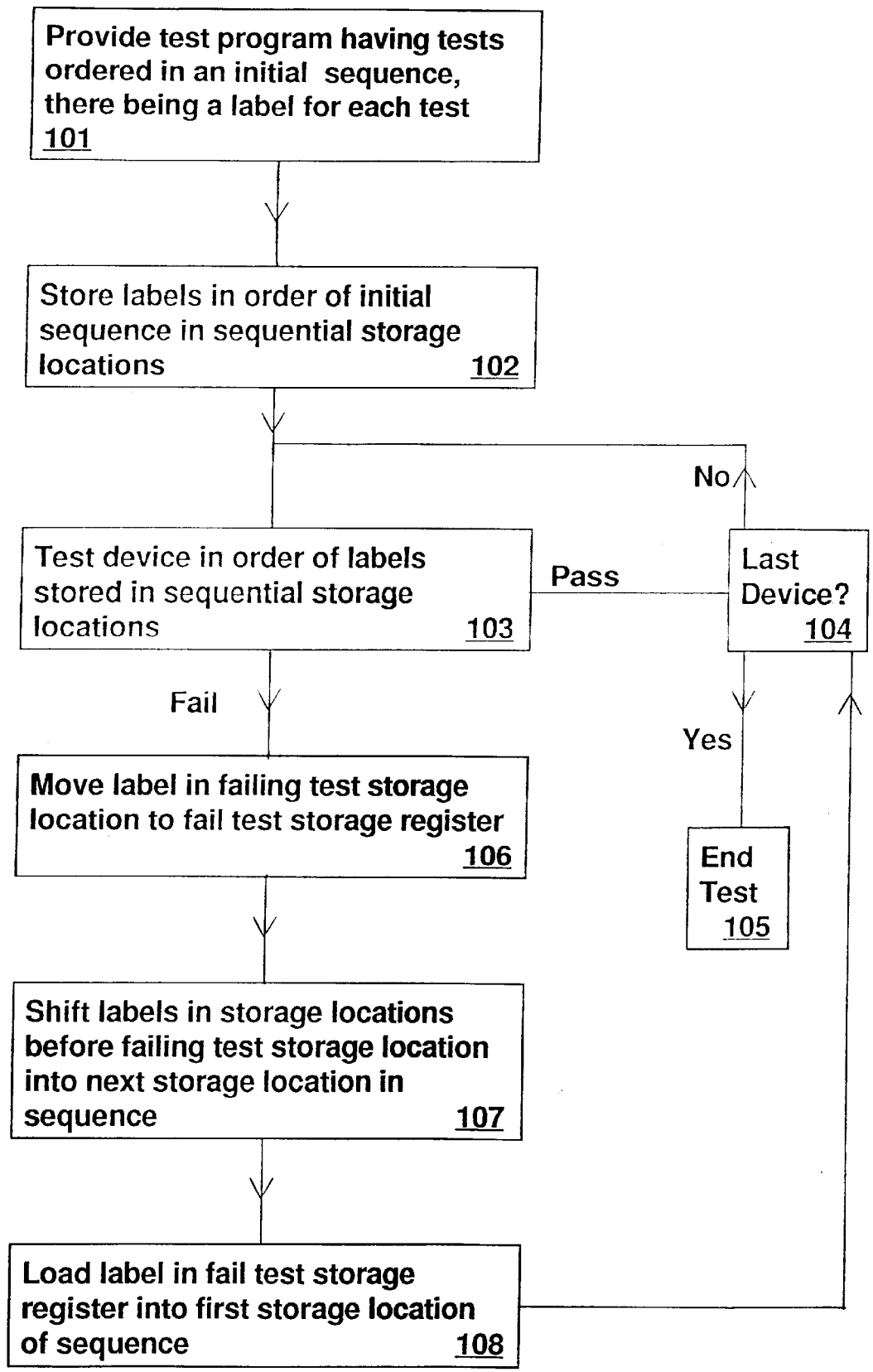
FIG. 1 is a flow chart showing the steps in the process of reordering the test labels of a test program to automatically change the sequence of the tests.

The present invention provides a process for dynamically modifying a test program based on the results of testing. In one embodiment, the sequence of tests in a test program is reordered in response to test results during the testing of a group of electronic devices to significantly improve test efficiency. The reordering of tests is accomplished by reordering labels for each of the tests in a sequence of storage locations that is used by the tester to select tests to be run.

The flow chart in FIG. 1, illustrates steps in the process of the present invention. In step 101, a test program having a plurality of tests is provided to an electronic device, such as one of the chips on a wafer. Each test of the test program has a unique label, and the labels are in a given sequence or order in the test program when the program is presented to the first chip to be tested. In step 102, the labels are stored in sequential storage locations in the tester before testing begins. Slightly more efficiently, the labels can be stored in the storage locations during the running of the test program to test the first chip. In step 103 chips of the wafer are tested with the given test program either until the last chip of the group of wafers is tested with the test program or until a chip is tested that fails. In step 104, if the last chip is tested the testing ends as shown in step 105. Otherwise testing continues with the given test program until a chip is tested that fails.

In step 106, the label of the test that caused the failing chip to fail is stored in a fail test storage register (FTSR) in the tester. In step 107 all labels in the sequential storage locations before the failing test label are shifted down one position. In step 108, the label for the failing test that is in the fail test storage register is loaded into the first storage location of the sequence.

If the chip that failed is not the last chip to be tested (step 108) then more chips are tested using steps 103 to 108. The next device is then tested according to step 103.

TABLE 1

Using Test Results to Reorder the Sequence of Tests (a) Device tested: #1
Data in Sequential Storage Locations

| Storage Location | Data in storage location |
|---|---|
| 1 | label 1 |
| 2 | label 2 |
| 3 | label 3 |
| 4 | label 4 |
| 5 | label 5 |
| 6 | label 6 |
| . | . |
| . | . |
| . | . |
| 200 | label 200 |

Result of test: Fail test of label 4
Data to be loaded in FTSR: Label 4
(b) Device tested: #2

| Storage Location | Data in storage location |
|---|---|
| 1 | label 4 |
| 2 | label 1 |
| 3 | label 2 |
| 4 | label 3 |
| 5 | label 5 |
| 6 | label 6 |
| . | . |
| . | . |
| . | . |
| 200 | label 200 |

Result of test: Fail test of label 5
Data to be loaded in FTSR: Label 5
(c) Device tested: #3

| Storage Location | Data in storage location |
|---|---|
| 1 | label 5 |
| 2 | label 4 |
| 3 | label 1 |
| 4 | label 2 |
| 5 | label 3 |
| 6 | label 6 |
| . | . |
| . | . |
| . | . |
| 200 | label 200 |

Result of test: none fail
Data to be loaded in FTSR: Label 5
(d) Device tested: #4

| Storage Location | Data in storage location |
|---|---|
| 1 | label 5 |
| 2 | label 4 |
| 3 | label 1 |
| 4 | label 2 |
| 5 | label 3 |
| 6 | label 6 |
| . | . |
| . | . |
| . | . |
| 200 | label 200 |

Result of test: Fail test of label 200
Data to be loaded in FTSR: Label 200
(e) Device tested: #5

| Storage Location | Data in storage location |
|---|---|
| 1 | label 200 |
| 2 | label 5 |

TABLE 1-continued

Using Test Results to Reorder the Sequence of Tests

| | |
|---|---|
| 3 | label 4 |
| 4 | label 1 |
| 5 | label 2 |
| 6 | label 3 |
| . | . |
| . | . |
| . | . |
| 200 | label 199 |

Result of test: Fail test of label 1
Data to be loaded in FTSR: Label 1
(f) Device tested: #6

| Storage Location | Data in storage location |
|---|---|
| 1 | label 1 |
| 2 | label 200 |
| 3 | label 5 |
| 4 | label 4 |
| 5 | label 2 |
| 6 | label 3 |
| . | . |
| . | . |
| . | . |
| 200 | label 199 |

Result of test: Fail test of label 2
Data to be loaded in FTSR: Label 2

A further illustration of the dynamic reordering of tests in a test program provided on a tester is given in Table 1(a–f). As shown in part (a) of Table 1, labels for the initial sequence of tests provided in the original test program are first stored in sequential storage locations in the tester. Thus label 1 for the first test in the original sequence of tests in the test program is stored in storage location 1, label 2 for the second test is stored in storage location 2, and so on up to label 200 for the last test stored in storage location 200. Device #1 is tested in order of that original sequence of labels, and it fails the test for label 4. Label 4 is then stored in the fail test storage register (FTSR).

Before Device #2 is tested a new sequence of tests is generated according to steps 107 and 108 of FIG. 1 which have the result of placing failing label 4 in the first storage location of the sequential storage locations in the tester while shifting labels 1, 2, and 3 to the next three storage locations, that is, to storage locations 2, 3, and 4 as shown in part (b) of Table 1. All labels in storage locations beneath the original position of failing test 4 remain in their original storage locations. As described in the process shown in FIG. 1, the shifting of label 3 to storage location 4, of label 2 to storage location 3, and of label 1 to storage location 2 occurs first to provide space at the beginning of the sequence in storage location 1 for the insertion of label 4 from the fail test storage register.

Device #2 is now tested using this revised sequence of tests. In the example shown in part (b) of Table 1, device #2 passes the tests of labels 4, 1, 2, and 3. It then fails the test of label 5. Label 5 is then stored in the FTSR. As shown in part (c) of Table 1, all labels in storage locations above failing test 5 are shifted down one storage location and failing test label 5 is moved from the FTSR into storage location 1.

Device #3 is now tested using this revised sequence of tests. In the example shown in part (c) of Table 1, device #3 passes the tests of all the labels, including labels 5, 4, 1, 2, . . . 200. It fails none of the tests. Label 5 remains stored in the FTSR. As shown in part (d) of Table 1, since label 5, for failing test 5, is already the first label in the sequence and since there are no labels in storage locations above failing test 5, no labels are shifted down one storage location. Failing test label 5 remains in storage location 1. There is no change in the sequence of tests.

Device #4 is now tested using this sequence of tests. In the example shown in part (d) of Table 1, device #4 passes the tests of labels 5, 4, 1, 2, 3, 6, . . . 199. It then fails the test of label 200. Label 200 is then stored in the FTSR. As shown in part (e) of Table 1, all labels in storage locations above failing test 200 are shifted down one storage location and failing test label 200 is moved from the FTSR into storage location 1.

Device #5 is now tested using this revised sequence of tests. In the example shown in part (e) of Table 1, device #5 passes the tests of labels 1, 200, 5, and 4. It then fails the test of label 1. Label 1 is then stored in the FTSR. As shown in part (f) of Table 1, all labels in storage locations above failing test 1 are shifted down one storage location and failing test label 1 is moved from the FTSR into storage location 1.

The savings in test time is dramatically illustrated by the example in part (e) of Table 1 where the test of label 200 is conducted first. Thus, we have a test that originally was at the end of the test program being run at the beginning of the program in response to the fact that a device failed that test. In subsequent tests the test of label 200 will remain near the beginning of the test program, reflecting the fact that the test of label 200 had a fail.

Device #6 is now tested using this revised sequence of tests. In the example shown in part (f) of Table 1, device #6 passes the tests of labels 200, 5, and 4. It then fails the test of label 2. Label 2 is then stored in the FTSR. Not shown is the shifting of all labels in storage locations above failing test 1 down one storage location while failing test label 2 is moved from the FTSR into storage location 1.

While reordering to put the failing test first in the sequence is preferred, other reordering schemes are possible, such as dynamically reordering so that the tests are in order of the probability of failing. The accumulated test data is used to calculate these probabilities and the labels are dynamically arranged in the sequential storage locations in order of this probability. This data can be processed using computational facilities in the tester or on an auxiliary computer directly linked to the tester that reads the test data and provides statistical information back to the tester. Other information, such as the time it takes to perform each test can also be factored into the ordering scheme. Thus, the labels can be arranged and a device tested with tests ordered according to the probability of causing a fail as weighted by the time for each test to optimize test efficiency.

In addition to reordering based on individual failing test data, it is also possible to reorder including the results of several tests that combine to provide a fail. All the tests involved in the failing condition would then be moved earlier in the test sequence. The process for reordering is accomplished for each failing test sequentially or two or more failing test storage registers could be used to reorder all the tests in one step.

Electronic devices are frequently tested at one voltage condition and then retested at a different voltage condition. In the invention a series of tests performed at the first voltage condition can be reordered independently of the order of tests for the second voltage condition. Thus, the same sequence of tests can be performed at each voltage condition and in a different order based on the test data to improve test efficiency.

The present invention is applicable to a wide range of modifications of a test program in addition to reordering the tests. For example, tests can be deleted from active use or added to active use by adding a label to or deleting a label from the sequential storage locations. The deletion or addition of a label may be based on pass rate statistics accumulated in the tester.

Also, the electronic devices can include a built in self-test (BIST) circuit. A sequence of seed patterns is provided by the tester to provide a sequence of tests run by the BIST circuit. The results of each test is compared with a signature pattern provided by the tester to determine whether the chip has passed each test. The present invention can be used to reorder the sequence of seed patterns and signature patterns so that a seed that causes a fail is provided earlier in the sequence.

The present invention is particularly suitable for scan design testing. Scan design testing is described in a paper, "A Logic Design Structure for LSI Testing," by E. Eichelberger and T. W. Williams, in the Proceedings of the $14^{th}$ Design Automation Conference, June 1977, p. 462–468. Scan design testing initializes logic on a chip when data is serially loaded into scan chain latches. In the next step, the initialization is accomplished when a clock pulse simultaneously loads data from the latches into the chip logic. This data propagates through the chip logic. Another clock pulse loads logic data that has reached a scan chain latch into that scan chain latch. Data from all the scan latches is serially unloaded and compared to expected data to determine whether the logic is good or bad. This set of steps, scanning-in to scan latches, initializing and propagating through logic, loading of scan latches from the logic, and scanning-out consititute a single functional test using scan design testing. Because the chip is initialized with each scan-in operation, these functional tests can be applied in any order. The present inventor recognized that the scan-in step constitutes an initialization that permits reordering.

By contrast, standard vector testing does not involve an initialization step with every functional test. The state of the chip at the beginning of a functional test is determined by the state of the chip at the end of the last functional test. The validity of the subsequent functional test depends on the the logic being in a state determined by the previous functional test. Thus, reordering of tests would render the tests meaningless. At the least, an initialization step to provide the chip in the proper state would be needed to allow reordering of the functional tests, and the time for this initialization would defeat the value of reordering.

While several embodiments of the invention, together with modifications thereof, have been described in detail herein and illustrated in the accompanying drawings, it will be evident that various further modifications are possible without departing from the scope of the invention. Nothing in the above specification is intended to limit the invention more narrowly than the appended claims. The examples given are intended only to be illustrative rather than exclusive.

What is claimed is:

1. A method of testing a plurality of electronic devices for defect assessment, failure analysis, quality inspection and/or error observation comprising the steps of:

(a) providing a plurality of electronic devices to a tester for electrical testing;

(b) providing a plurality of individual tests that define a functional test block having a large number of test patterns used in a sequence during testing said plurality of electronic devices;

(c) testing a first electronic device of said plurality of devices with said plurality of functional tests, wherein an initializing step is done a plurality of times during said testing with said plurality of functional tests;

(d) obtaining a result of said testing step (c) in regards to passing or failing the individual functional tests and in case of any noted failure identifying the individual functional tests that failed;

(e) dynamically reordering the sequence for said plurality of functional tests within said functional test block based on said result in said step (d); and (f) testing a second electronic device of said plurality of devices with said reordered functional tests, wherein an initializing step is done a plurality of times during said testing with said reordered functional tests.

2. A method as recited in claim 1, wherein said plurality of electronic devices of said step (a) comprise a plurality of semiconductor chips.

3. A method as recited in claim 2, wherein said plurality of semiconductor chips are part of a semiconductor wafer, said testing steps (a) to (f) being conducted before dicing said wafer.

4. A method as recited in claim 1, wherein said initializing step is done as a first step for each functional test.

5. A method as recited in claim 1, wherein in said testing step (b) said first electronic device passes a first test and then fails a second test and wherein said modifying step (d) comprises placing said second test before said first test.

6. A method as recited in claim 5, wherein each of said plurality of tests has a label, said testing step (c) further comprises storing said labels in sequential storage locations, said result obtaining step (d) comprising storing said label of said second test in a storage register, said reordering step (e) comprising the step of moving a label of said first test from a first storage location to a second storage location and moving said label of said second test from said storage register to said first position.

7. A method as recited in claim 6, wherein said label storing step comprises storing said labels in sequential storage locations before a test is performed on said first electronic device.

8. A method as recited in claim 6, wherein said label storing step comprises storing said labels in sequential storage locations as each test is performed on said first electronic device.

9. A method as recited in claim 5, wherein said second test is placed first.

10. A method as recited in claim 5, wherein said plurality of electronic devices comprise a built in self-test circuit, wherein said first test is accomplished by providing a first seed to the built in self-test circuit and said second test is accomplished by providing a second seed to the built in self-test circuit.

11. A method as recited in claim 1, wherein said electronic devices comprise a built in self-test circuit, wherein in said testing step (c) a first seed is provided to the built in self-test circuit before a second seed is provided and wherein in said testing step (f) said second seed is provided before said first seed.

12. A method as recited in claim 1, wherein, in said reordering step, said tests are reordered depending on their probability of causing a fail.

13. A method as recited in claim 1, wherein, in said reordering step, said tests are reordered depending on time for each of said tests to cause a fail.

14. A method as recited in claim 1, wherein said plurality of tests are included in a test program, said reordering step (e) being performed without recompiling said test program.

15. A method as recited in claim 1, further comprising probing said first electronic device and then probing said second electronic device, there being an index time there between, wherein said reordering step (e) is performed during said index time.

16. A method as recited in claim 1, further comprising the step of adding or deleting tests.

17. A method as recited in claim 1, wherein said plurality of tests are run at a first test condition and wherein said plurality of tests are repeated at a second test condition, wherein said reordering step (e) comprises the step of reordering said plurality of tests in said first test condition differently than in said second test condition.

18. A method as recited in claim 17, wherein each of said plurality of tests in said first test condition has a label, said testing step (c) further comprises storing said labels in first condition sequential storage locations, and wherein each of said plurality of tests in said second test condition has a label, said testing step (c) further comprises storing said labels in second condition sequential storage locations.

19. A method as recited in claim 1, wherein said plurality of semiconductor chips are scan design chips.

* * * * *